United States Patent [19]
Troy

[11] 3,956,642
[45] May 11, 1976

[54] VOLTAGE-CONTROLLED SWEEP MULTIVIBRATOR

[76] Inventor: Stephen R. Troy, 104-20 89th Ave., Richmond Hill, N.Y. 11418

[22] Filed: Jan. 20, 1975

[21] Appl. No.: 542,639

[52] U.S. Cl. ............................ 307/228; 307/252 F; 307/273; 307/283
[51] Int. Cl.² ...................... H03K 4/08; H03K 3/335
[58] Field of Search ............... 307/228, 252 F, 273, 307/283, 301

[56] References Cited
UNITED STATES PATENTS
3,497,725   2/1970   Lorditch, Jr. ........................ 307/283

OTHER PUBLICATIONS
"Tunnel Diode Switch with Amplitude Sensitive Reset" by Ward IBM Tech. Discl. Bull., Vol. 4, No. 7, Dec. 1961 p. 54.

"Ramp Generator has Adjustable Retrace" by Tenny Electronic Design 20, Sept. 27, 1970 p. 71.

Primary Examiner—Stanley D. Miller, Jr.
Attorney, Agent, or Firm—Joseph E. Rusz; Jacob N. Erlich

[57] ABSTRACT

A multivibrator capable of extremely high-speed operation and producing a linear sweep waveform. This multivibrator contains within the circuitry thereof a "digital" device such as a NAND gate being used in a "gated linear" mode of operation, a linear, voltage-to-current converter used to convert the output voltage of the "digital" device into a charging current, a capacitor which integrates the charging current thereby converting an amplitude into a time interval and a voltage-sensitive switch. As a result thereof the multivibrator of this invention requires only one voltage supply and the useable sweep output voltage is a very large fraction of the supply voltage.

18 Claims, 9 Drawing Figures

VOLTAGE-CONTROLLED SWEEP MULTIVIBRATOR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to multivibrators, and, more particularly, to a voltage-controlled sweep multivibrator which incorporates within the circuit a "digital" gate.

A multivibrator is a form of relaxation oscillator consisting normally of two or more active devices, such as transistors or vacuum tubes, interconnected by electric networks. In a multivibrator a portion of the output voltage or current of each active device is applied to the input of the other with such magnitude and polarity as to maintain the devices alternately conducting over controllable periods of time. Such an electronic circuit has an extremely broad range of applications, in such equipment as oscilloscopes, telemetry systems, computer terminals, television cameras and signal processors, electronic music systems, etc.

In the past, the conventional unijunction transistor (UJT) multivibrator utilized a resistor as a means of controlling the capacitor charging current. This method, however, limits the range of sweep repetition rates (SRR) that can be obtained since:

a. If the resistance value is too large, the charging current will be too small to overcome inevitable leakage losses in the capacitor and UJT, so the capacitor will never charge to the UJT switching voltage; and b. If the resistance value is too small, the charging current will exceed the UJT latching current, so the UJT will never switch OFF.

UJT multivibrators using transistors as charging current sources have the major advantage over the simple types referred to hereinabove in that their sweep output waveform is a linear sawtooth rather than an exponential sawtooth. However they do not escape the limitations on SRR imposed by the leakage and latching current considerations as set forth above.

Therefore, in order to achieve high performance many components had to be used, thus, creating a great expense. Although UJT multivibrators offer obvious benefits in sweep circuitry, their performance cannot match conventional sweep generators, particularly at high speeds.

SUMMARY OF THE INVENTION

The instant invention overcomes the problems encountered by multivibrators of the past by utilizing in a novel manner a "digital" device such as a NAND gate within the circuit. The use of this "digital" device in a unique manner compliments the properties of the UJT multivibrator, resultling in a composite circuit which preserves the advantages of linear waveshape, yet bypasses the limitations imposed by the current considerations as set forth above.

This invention is made up of a UJT multivibrator circuit having added thereto a "digital" device such as a NAND gate. In addition the connection of a feedback resistor from the "digital" device output to one of its inputs forces the device into a linear mode of operation as long as the other input is held at a logical "high." This may be called a "gated linear" mode of operation. Thus the device behaves much like an operational amplifier. It exhibits a high input impedance and a low output impedance.

While any of the logic families mentioned may be used, CMOS (complementary metal-oxide-semiconductor) logic has been found most suitable due to its wide tolerance of power supply voltages and low power consumption.

Since the "digital" device used in this invention is voltage-inverting, a positive-going voltage at the control input causes an increase in the current fed to the sweep capacitor, thus an increase in the SRR. With proper selection of component values, SRR is linearly related to the control voltage.

In operation when the unijunction transistor (UJT) fires, the base 2 voltage thereof drops producing a negative-going pulse which is fed into the second input of the digital device. This causes the digital device output to go high, immediately biasing the current source transistor into cutoff. The UJT discharges the capacitor very rapidly and unlatches, causing the base 2 voltage to rise, the "digital" device to be restored to linear mode, and the sweep operation to resume. This switching operation almost completely eliminates the UJT latching current as a controlling factor in high-speed operation of the multivibrator of this invention.

In addition to the circuit described above, the instant invention is also capable of numerous variations of the basic circuit which will be described in detail hereinbelow.

It is therefore an object of this invention to provide a multivibrator capable of extremely high-speed operation.

It is another object of this invention to provide a multivibrator wherein an exceptionally wide range of sweep repetition rates can be achieved without range switching.

It is a further object of this invention to provide a multivibrator in which a sweep may be obtained which is an exceptionally large fraction of the power supply voltage; only one supply volage being required.

It is still another object of this invention to provide a multivibrator which is capable of producing a linear sweep waveform.

It is a further object of this invention to provide a multivibrator which is economical to produce, extremely versatile in operation and which utilizes conventional, currently available components that lend themselves to standard mass producing manufacturing techniques.

For a better understanding of the present invention together with other and further objects thereof reference is made to the following description taken in connection with the accompanying drawing and its scope will be pointed out in the appended claims.

3

Figure 5:
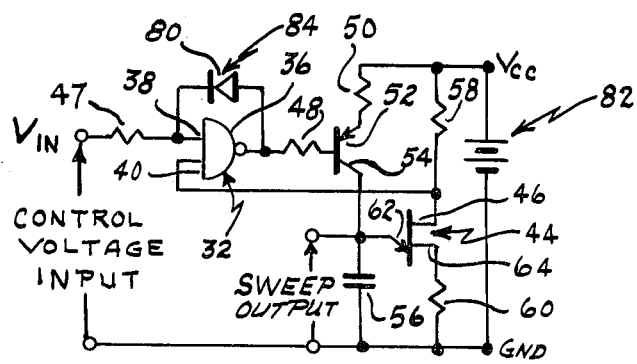
Figure 6:
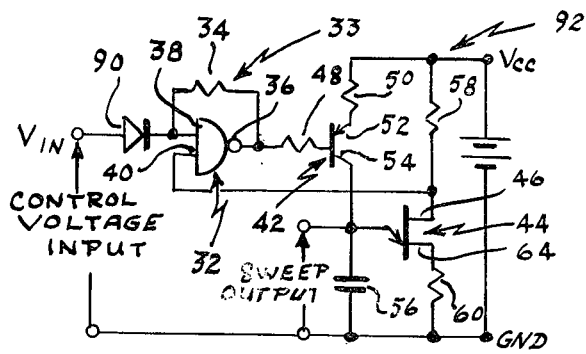
Figure 7:
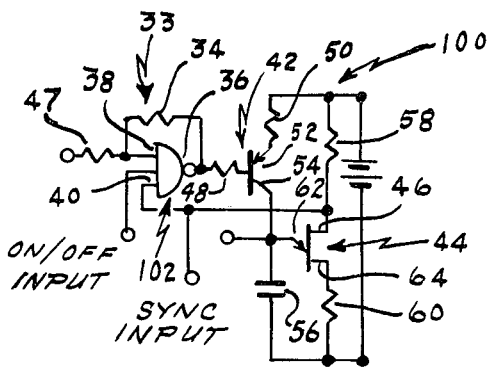
Figure 8:
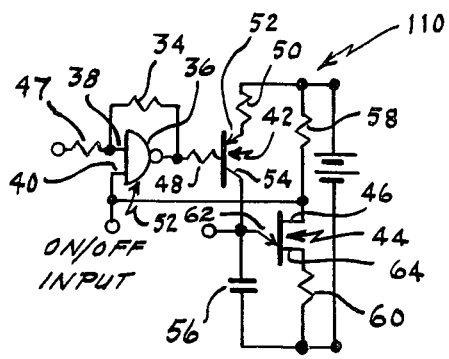
Figure 9:
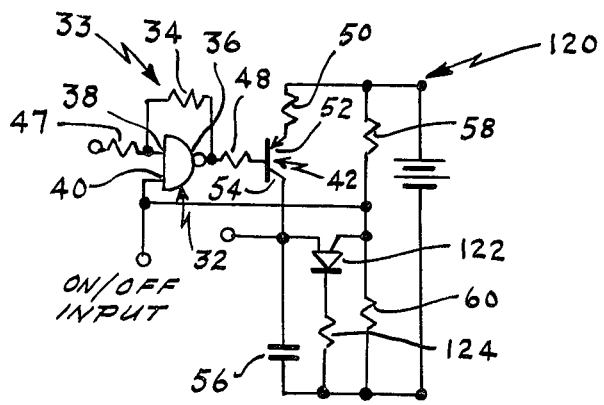

(UJT);

FIG. 5 is a schematic diagram of the multivibrator of this invention in which the feedback resistor is replaced by a diode;

FIG. 6 is a schematic diagram of the multivibrator of this invention in which the input resistor is replaced by a diode;

FIG. 7 is a schematic diagram of the multivibrator of this invention in which a 3-input "digital" gate is used for on/off control;

FIG. 8 is a schematic diagram of the multivibrator of this invention in which the "digital" gate of FIG. 7 is modified for on/off control; and FIG. 9 is a schematic diagram of the multivibrator of this invention in which a programmable unijunction transistor (PUT) replace the unijunction (UJT).

DETAILED DESCRIPTION OF THE PREFERRED EMBODIMENTS

Figure 1:
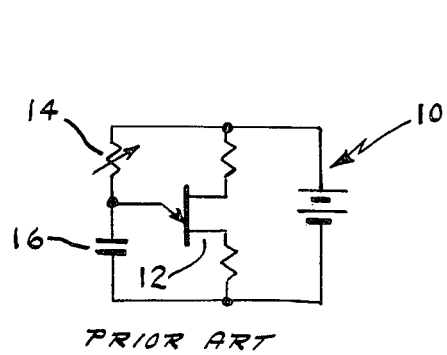
FIG. 1 is a schematic diagram of a conventional prior art multivibrator.
Figure 2:
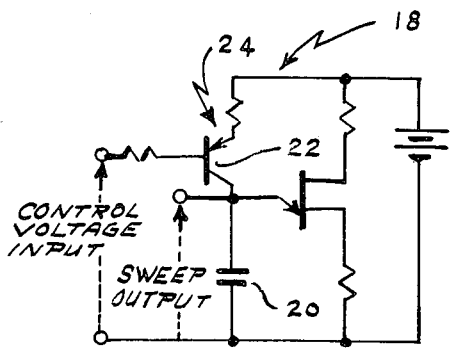
FIG. 2 is a schematic diagram of a conventional prior art voltage-controlled sweep multivibrator.

Reference is now made to FIGS. 1 and 2 of the drawing which disclose conventional multivibrators which are found in the prior art. For example, FIG. 1 is a schematic representation of a simple multivibrator 10 whose fastest sweep repetition rate (SRR) achievable is determined, everything else being equal, by the latching current of unijunction transistor (UJT) 12. Such an arrangement, therefore, places a lower limit on the value of the resistor 14. The slowest SRR achievable is determined by the leakage current of transistor 12 and the sweep capacitor 16, thus placing an upper limit on the value of resistor 14. These upper and lower limits on the values of resistor 14 in turn control the range of sweep repetition rates that can be achieved. Furthermore, the sweep waveform produced by multivibrator 10 is a exponential (sawtooth), rather than a linear sweep.

FIG. 2 represents a schematic diagram of a conventional voltage-controlled sweep multivibrator 18. Multivibrator 18 has two readily apparent benefits over multivibrator 10 shown in FIG. 1. First, the current charging sweep capacitor 20 is constant and so the waveform is linear, and, second, the large AC impedance at the collector 22 of transistor 24 tends to extend the range of SRR achievable as compared with the discussion of resistor 14 in multivibrator 10 of FIG. 1. Unfortunately, the multivibrators of the past and as set forth in FIGS. 1 and 2 of the drawing do not escape the limitations on SRR imposed by the leakage and latching current considerations as set forth in detail hereinabove in the Background of the Invention.

Figure 3:
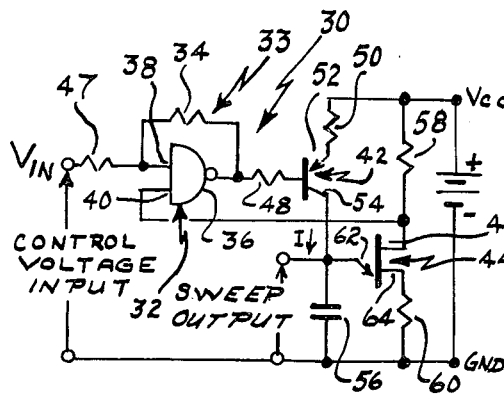
FIG. 3 is a schematic diagram of the voltage-controlled sweep multivibrator of this invention.

The voltage-controlled sweep multivibrator 30 of the instant invention as schematically illustrated in FIG. 3 overcomes the problems encountered in the past by adding to the circuit a suitable "digital" device such as a NAND gate 32. The use of a "digital" device in this unique way compliments the properties of the UJT multivibrator 18, for example, resulting in the composite circuit of multivibrator 30 of this invention. NAND gates 32 of the type used in this invention are commonly available in "logic" families such as resistor transistor logic (RTL), transistor transistor logic (TTL) and complimentary metal-oxide-semiconductor (CMOS). In addition to the "digital" gate or NAND gate 32 the connection of a feedback path 33 including resistor 34 from the output 36 of NAND gate 32 to one of its inputs 38 forces the device into a linear mode of operation as long as the other input 40 is held at a logical "high" in a manner to be described in detail hereinbelow.

It should be noted, however, that the circuit components shown in FIG. 3 represent only one possible version of this invention since, for example, a reversed-polarity version of the instant invention could be assembled using a NOR gate for NAND gate 32, an NPN transistor for transistor 42 and a complimentary UJT.

Still referring to FIG. 3, for a proper understanding of multivibrator 30 it is to be assumed that during operation thereof UJT 44 is to be OFF or nonconducting. Therefore, the voltage at its base 2, 46, is at a logical HIGH, which is fed into input 40 of "digital" NAND gate 32. The table set forth hereinbelow represents a normal operation of a "digital" device such as NAND gate 32:

| INPUT 38 | INPUT 40 | OUTPUT 36 |
|----------|----------|-----------|
| HIGH     | HIGH     | LOW       |
| LOW      | HIGH     | HIGH      |
| HIGH     | LOW      | HIGH      |
| LOW      | LOW      | HIGH      |

Note that as long as input 40 is HIGH, the output state is the opposite of input 38, whereas when input 40 goes LOW, output 36 is always HIGH no matter what input 38 does.

Assuming, as above, that input 40 is HIGH, the existence of a feedback path 33 from output 36 to input 38 forces NAND gate 32 to depart from normal digital circuit behavior. If the feedback path 33 is provided via a resistor 34 as shown, then NAND gate 32 performs similarly to linear operational amplifier. If the control voltage input is Vin, the output voltage of NAND gate 32, V out, is given approximately by $$V_{out} - \frac{V_{cc}}{2} = - \frac{R34}{R47} \left( V_{in} - \frac{V_{cc}}{2} \right) \quad \text{(Eq 1)}$$

Resistors 48 and 50 and transistor 42, form a linear voltage-to-current converter. The function performed by transistor 42 could be performed by other devices, such as a field-effect transistor. The main purpose of resistor 50 is to "swamp out" nonlinear effects in the base-emitter junction 52 of transistor 42, while the main purpose of resistor 48 is to set the proportionality factor K for voltage-to-current conversion. The current I at collector 54 of transistor 42 is given approximately by:

$$I = K (V_{cc} - V_{out}) \quad (2.)$$

Since UJT 44 is assumed nonconducting, all the current I from the collector 54 of transistor 42 goes into capacitor 56 and charges it. The voltage across th capacitor 56, the sweep output voltage, is proportional to the time integral of the charging current of capacitor 56, which in turn is related to the control voltage input as shown by Eq. 1. The result is that the charging rate of capacitor 56 can be set, anywhere over a very wide range, by adjustment of Vin.

Under the bias conditions established by the values of Vcc, resistors 58 and 60, UJT 44 will switch to a conducting or ON state when the voltage at its emitter 62, in this circuit, the sweep output voltage, reaches some specific value called Vp. When this happens, UJT 44 becomes practically a short circuit from emitter 62 to base 1, 64, and also from base 2, 46, to base 1, 64. The voltage at 46 therefore drops to a logical LOW. UJT 44 remains in this state as long as the current entering its emitter 62 is greater than a minimum value called Iv, the "latching" current. When the current entering emitter 62 becomes less tha Iv, UJT 44 switches OFF, the emitter current drops abruptly to almost zero, and the base 2 voltage at 46 returns to a logical HIGH.

When the sweep output voltage reaches Vp, UJT 44 turns ON and the base 2 voltage at 46 drops to a logical LOW. Referring to the table set forth above, this LOW applied to input 40 causes the output at NAND gate 32 to (almost) instantly become HIGH, so that Eq 1 no longer applies. This HIGH output means Vout practically equals Vcc, the positive power supply voltage, so I becomes essentially zero by Eq 2. The only source of current at the emitter 62 of UJT 44 is now the stored charge in capacitor 56, which discharges very rapidly through UJT 44 and resistor 60. When the discharge current at capacitor 56 falls below Iv, as described above, UJT 44 switches OFF. Its emitter 62 stops conducting, while its base 2 voltage at 46 returns to a HIGH input for input 40 of NAND gate 32. NAND gate 32 returns to linear operation according to Eq 1, transistor 42 again feeds charging current to capacitor 56, and the same cycle begins over again.

The remaining circuits shown in FIGS. 4-9 represent modifications of the preferred multivibrator 30 shown in FIG. 3. These embodiments, schematically illustrated in FIGS. 4-9, use essentially the same elements as used with multivibrator 30, and in view thereof, for purpose of simplicity, all like elements will be referred to by the same element numerals as set forth in FIG. 3.

Figure 4:
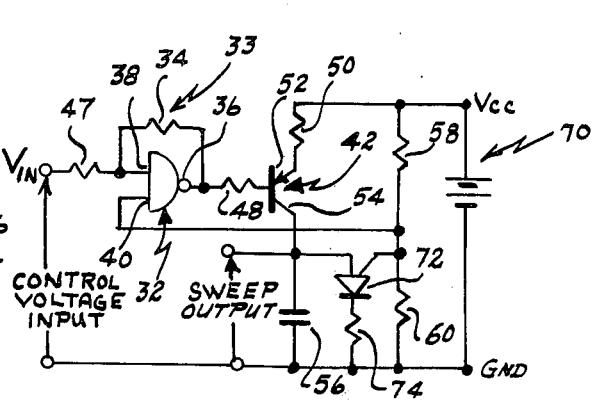
FIG. 4 is a schematic diagram of the multivibrator of this invention utilizing a programmable unijunction transistor (PUT) in place of the unijunction transistor

FIG. 4 is the same circuit as shown in FIG. 3, hereinafter referred to as multivibrator 70, but incorporates therein a programmable unijunction transistor (PUT) 72 and resistor 74, rather than a UJT 44. In general, UJT 44 will operate at a higher SRR, eg., several hundred thousand sweeps per second. However, the PUT 72 is better suited for lower speed operation and has the advantage of giving a useful sweep outout whose amplitude is a larger fraction of the power supply voltage. When PUT 72 is used with a CMOS gate, the SRR tends to be independent of changes in the power supply voltage. In addition to control of SRR by an external voltage, the circuit of multivibrator 70 can readily be synchronized by means of external pulses. This feature is especially useful in a wide variety of television cameras, video signal processing, and television display applications.

If the feedback resistor 34 of multivibrator 30 is replaced by a diode 80 as shown in the multivibrator 82 of FIG. 5, forming feedback path 84, and if the control input voltage is resistricted to more than half of the power supply voltage, and if the values of the remaining components are adjusted accordingly, the SRR will be approximately proportional to the logarithm of the control voltage. This is very useful in some applications, e.g., in telemetry. Similarly, if the input resistor 47 of multivibrator 30 is replaced by a diode 90 as shown in the multivibrator 92 of FIG. 6, the control voltage limited to more than half the supply voltage, and other values adjusted, the SRR is approximately proportional to the antilogarithm of the control voltage. Such a modification is very useful in certain applications.

FIGS. 7, 8 and 9 show how on/off control of the sweep multivibrator 30 of FIG. 3 is greatly simplified by the use of a digital gate 32. In all three cases, the multivibrators 100, 110 and 120, shown in FIGS. 7, 8 and 9, respectively, run when the on/off input is raised to a logical "high," and stops when the on/off input is fed a logical "low." The standby power consumption is very small when multivibrators 100, 110 and 120 are turned off, which is important in many battery-powered applications.

In particular, the multivibrator 100 of FIG. 7 shows the use of a 3-input NAND gate 102 for this purpose, such as conventionally obtainable as Texas Instruments No. SN5410 (TTL) or RCA No. CD4023 (CMOS). With this arrangement, the sweep will stop and maintain a constant value whenever the on/off input is brought low. While not intended for long-term sample-and-hold applications, multivibrator 100 can be used as a short-term sample-and-hold device, e.g., as a demodulator for pulse-width or pulse-displacement modulated signals, etc. The sync input gives a means of resetting the circuit via an external clock.

FIG. 8 shows a multivibrator 110, a modified version of multivibrator 100 for on/off control. The advantage of multivibrator 110 is that it combines the functions of the separate on/off and sync inputs of multivibrator 100 so that, when the on/off input is brought high, the sweep always starts predictably at the beginning. This makes the circuit attractive for use in television systems, for example, where a precisely timed blanking interval must be inserted between sweeps.

As stated above, PUTs can be substituted for UJTs in any of the applications shown, although their slightly different characteristics make one preferable to the other in any specific application. The multivibrator 120 of FIG. 9 shows a PUT 122 and resistor 124 in the circuit of FIG. 8. If suitably large resistances are chosen for resistors 58 and 60 a CMOS NAND gate 32 is used, and other components chosen judiciously, the standby power consumption will be extremely small. In all the above applications shown, it is an intrinsic property of the voltage-controlled sweep multivibrator 30 of this invention that the peak-to-peak sweep amplitude remains constant regardless of SRR.

Although many variations of multivibrator 30 have been described hereinabove, the following basic features remain essential to all embodiments of this invention:

a. A "digital" gate, being used in a "gated linear" mode of operation, rather than in its normally intended digital mode. This device provides convenient input characteristics for interfacing to other circuitry, plus the capability for voltage amplification using linear, logarithmic, or other characteristics;

b. a precision, linear, voltage-to-current converter used to convert the output voltage of the "digital" gate into a charging current;

c. a capacitor, which integrates a charging current, thereby converting an amplitude into a time interval; and d. A precision voltage-sensitive switch, whose characteristics are uniquely complimentary to those of "digital" gate.

It should, however, be understood to those skilled in the art that this invention is also capable of a variety of alternate embodiments which encompass the essential features set forth above within the spirit and scope of the appended claims.

I claim:

1. A multivibrator compising a "digital" device having first and second inputs and an output, means electrically connected to said "digital" device for accepting a control voltage and directing said control voltage to said first input of said "digital" device, a feedback circuit electrically connected between said first input and said output of said "digital" device, means electrically connected to said output of said "digital" device for converting said "digital" device output voltage into a current, a capacitor electrically connected to said voltage converting means, a DC source electrically connected to said voltage converting means, and a voltage sensitive switching means electrically connected between said capacitor and said second input of said "digital" device whereby said multivibrator is capable of extremely high-speed operation and producing an exceptionally linear sweep waveform.

2. A multivibrator as defined in claim 1 wherein said "digital" device comprises a NAND gate.

3. A multivibrator as defined in claim 1 wherein said voltage converting means comprises a transistor.

4. A multivibrator as defined in claim 1 wherein said voltage sensitive switching means comprises a unijunction transistor.

5. A multivibrator as defined in claim 1 wherein said feedback circuit includes a resistor.

6. A multivibrator as defined in claim 1 wherein said feedback circuit includes a diode.

7. A multivibrator as defined in claim 1 further comprising a resistor electrically connected between said control voltage accepting means and said 37 digital" device.

8. A multivibrator as defined in claim 1 further comprising a diode electrically connected between said control voltage accepting means and said "digital" device.

9. A multivibrator as defined in claim 1 wherein said voltage sensitive switching means comprises a programmable unijunction transistor.

10. A multivibrator as defined in claim 1 wherein said "digital" device comprises a 3-input "digital" device.

11. A multivibrator as defined in claim 1 further comprising means for applying a separate on/off signal to said "digital" device.

12. A multivibrator as defined in claim 11 wherein said voltage sensitive switching means comprises a programmable unijunction transistor.

13. A multivibrator as defined in claim 1 wherein said "digital" device comprises a NOR gate.

14. A multivibrator as defined in claim 2 wherein said voltage converting means comprises a transistor.

15. A multivibrator as defined in claim 14 wherein said voltage sensitive switching means comprises a unijunction transistor.

16. A multivibrator as defined in claim 15 wherein said feedback circuit includes a resistor.

17. A multivibrator as defined in claim 16 further comprising a resistor electrically connected between said control voltage accepting means and said "digital" device.

18. A multivibrator as defined in claim 17 further comprising a resistor electrically connected between said output of said NAND gate and said voltage converting transistor.

* * * * *